United States Patent [19]

Winter

[11] Patent Number: 4,791,577
[45] Date of Patent: Dec. 13, 1988

[54] FREQUENCY SHIFT FOR REMOVING SPURIOUS SPECTRAL COMPONENTS FROM SPECTRUM ANALYZER OUTPUT

[75] Inventor: John E. Winter, Los Altos, Calif.

[73] Assignee: TRW Inc., Redondo Beach, Calif.

[21] Appl. No.: 783,498

[22] Filed: Oct. 3, 1985

[51] Int. Cl.⁴ .................. H04L 1/22; G01R 23/16; G06F 7/34

[52] U.S. Cl. .................. 364/485; 324/77 B; 364/487; 364/574; 371/68

[58] Field of Search .............. 364/485, 484, 487, 571, 364/574; 324/77 B, 79 R, 79 D; 328/133, 134; 371/68, 69

[56] References Cited

U.S. PATENT DOCUMENTS

| | | | |
|---|---|---|---|
| 3,096,479 | 7/1963 | Marks et al. | 364/485 X |
| 4,037,152 | 7/1911 | Griffith | 324/79 R |
| 4,084,245 | 4/1978 | Bunge | 364/485 |
| 4,166,251 | 8/1979 | Ishigaki et al. | 364/571 X |
| 4,264,959 | 4/1981 | Blaäss | 364/485 |
| 4,303,979 | 12/1981 | Kato et al. | 324/77 B |
| 4,317,206 | 2/1982 | Nossen | 364/485 |
| 4,568,878 | 2/1986 | Bales | 324/79 R |
| 4,573,153 | 2/1986 | Nakamura et al. | 371/68 X |
| 4,578,638 | 3/1986 | Takano et al. | 364/485 |
| 4,636,719 | 1/1987 | Zuk et al. | 324/79 R |

Primary Examiner—Parshotam S. Lall
Assistant Examiner—Edward R. Cosimano
Attorney, Agent, or Firm—Noel F. Heal; Benjamin DeWitt

[57] ABSTRACT

Apparatus for eliminating spurious spectral components from a spectral analyzer output signal. An input signal is mixed with two separate local oscillator frequencies separated by a frequency offset value to produce two intermediate-frequency signals, which are processed in spectral analyzers. The outputs of the analyzers are then compared to identify and eliminate any components that do not differ in frequency by the offset value.

12 Claims, 1 Drawing Sheet

FREQUENCY SHIFT FOR REMOVING SPURIOUS SPECTRAL COMPONENTS FROM SPECTRUM ANALYZER OUTPUT

BACKGROUND OF THE INVENTION

The present invention relates to spectrum analyzers for determining the Fourier transform or spectral distribution of an electrical signal waveform. More specifically, it relates to a system for removing from the output of the spectrum analyzer spurious spectral components caused by nonlinearities in the spectrum analyzer.

Since nonlinear distortion of a signal waveform produces spectral components not present in the original undistorted signal, any nonlinearities in a spectrum analyzer will cause its output to include spurious spectral components.

This problem is especially prevalent in digital spectrum analyzers in which the signal to be analyzed is sampled and quantized using an analog-to-digital (A/D) converter and then applied to a digital fast Fourier transform (FFT) processor. Nonlinear distortion is introduced by jitter in the sampling time, quantization errors and nonlinearities in the A/D converter, and arithmetic truncation in the FFT processor. These nonlinearities cause the output of the FFT processor to show spurious spectral components not actually present in the signal being analyzed.

SUMMARY OF THE INVENTION

The present invention is a system for suppressing or removing spurious spectral components from the output of a spectral analyzer. It comprises two superheterodyne mixer circuits, preferably having local oscillators operating at frequencies $f_{LO}$ and $(f_{LO}+\Delta f)$, respectively. The first mixer circuit receives the input signal and produces a first IF (intermediate frequency) signal having a spectral distribution the same as that of the input signal but shifted by the amount $f_{LO}$. Similarly, the second mixer circuit receives the input signal and produces a second IF signal whose spectrum is the same as that of the input signal but shifted by the amount $(f_{LO}+\Delta f)$.

The first and second IF signals are applied to first and second spectrum analyzers, respectively. The outputs of the two spectrum analyzers are compared to identify any spectral components in the output of the first analyzer that do not appear in the output of the second analyzer offset in frequency by the amount $\Delta f$. Any such components are spurious distortion products and are suppressed from the spectrum analyzer output.

DETAILED DESCRIPTION OF THE PREFERRED EMBODIMENT

Figure 1:
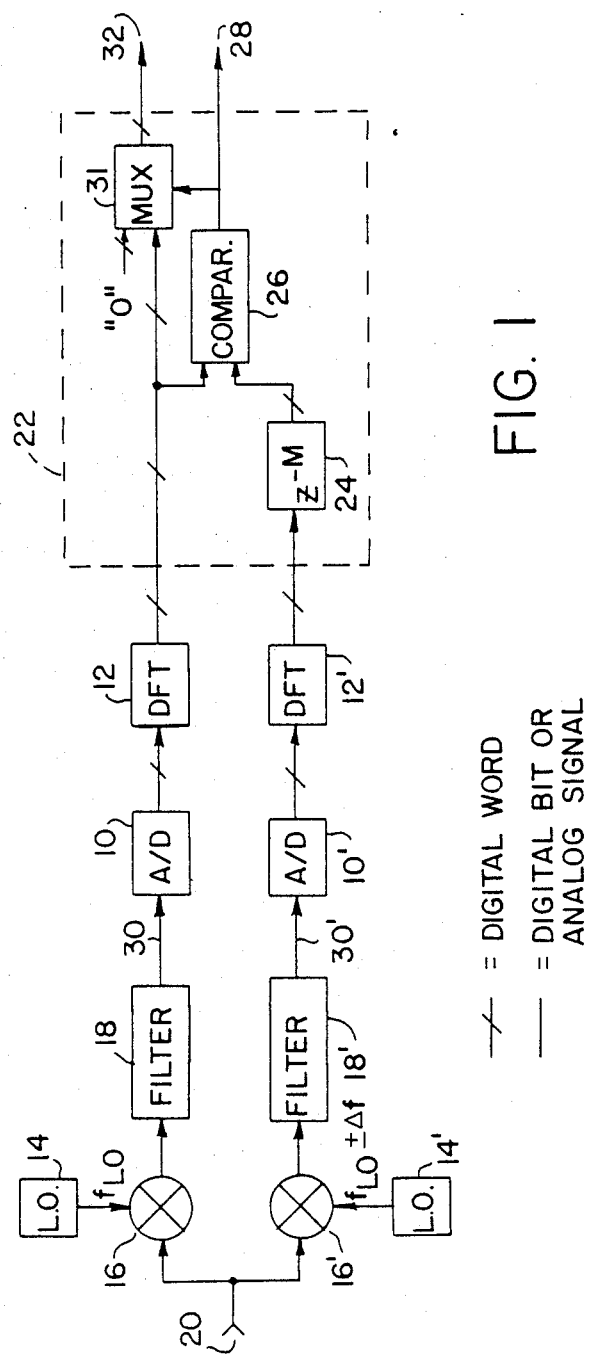
FIG. 1 is a block diagram of a spectrum analyzer according to the present invention.

The present invention is applicable to both analog and digital spectrum analyzers, but the preferred embodiment, shown in FIG. 1, is based on a conventional digital spectrum analyzer comprising an analog-to-digital (A/D) converter 10 and a discrete Fourier transform (DFT) processor 12. The A/D converter 10 periodically samples and quantizes the input signal whose spectrum is to be analyzed. The digital representation of the input signal produced by the A/D converter is applied to DFT processor 12, which computes the discrete Fourier transform of the digitized input signal. The output of the DFT processor is an array of numerical values in digital form, where each value represents the amplitude of a different spectral (i.e., frequency) component of the input signal.

In addition to the conventional digital spectrum analyzer just described, the present invention includes a superheterodyne mixer front-end comprising a local oscillator 14, a mixer 16 and a low pass filter or band pass filter 18. The local oscillator 14 produces a sinusoidal signal at a predetermined frequency $f_{LO}$. The mixer 16 receives the input signal 20 and the signal from local oscillator 14 and produces an output signal having two components, each of whose frequency or spectral distribution is the same as that of input signal 20, but shifted up or down in frequency by the amount $f_{LO}$. The low pass or band pass filter 18 attenuates one of these two components and passes on the other component to the A/D converter 10.

The operation of the invention is based on comparing the spectra of two signals derived from the same input signal 20 but offset in frequency by an amount $\Delta f$. Therefore, the preferred embodiment also includes a second local oscillator 14', mixer 16', filter 18', A/D converter 10', and DFT processor 12' connected in the same manner as the corresponding elements just discussed.

The input signal 20 is connected to the inputs of both the first and second mixers 16 and 16'. The second local oscillator 14' operates at a frequency $(f_{LO}+\Delta f)$ which is offset by an amount $\Delta f$ from the frequency $f_{LO}$ of the first local oscillator 14. Therefore, the spectra of the two IF signals 30 and 30' applied to the A/D converters 10 and 10', respectively, are offset from each other by the amount $\Delta f$. In other words, if signal 30 has two spectral components at frequencies $f_1$ and $f_2$, then signal 30' will have spectral components at frequencies $(f_1+\Delta f)$ and $(f_2+\Delta f)$.

The present invention is intended to identify and remove spurious spectral components in the output of the DFT processor 12, 12' caused by nonlinearities in the circuit elements following the mixer 16, 16'. These nonlinearities typically arise from a nonlinear conversion characteristic in the A/D converter 10, 10'; jitter in the sampling rate of the A/D converter; and arithmetic truncation within the DFT processor 12, 12'. These nonlinearities cause the output of the DFT 12, 12' to include harmonic distortion and intermodulation distortion components. Harmonic distortion components are spectral components at frequencies which are multiples of the frequency components of the original undistorted signal. Intermodulation distortion components are spectral components at frequencies which are sums and differences of the frequency components (and harmonics thereof) of the original undistorted signal.

For example, suppose the input signal 20 has two spectral components at frequencies $(f_{LO}+f_1)$ and $f_{LO}+f_2)$ so that the signal at the output of the first low pass filter 18 has two spectral components at frequencies f1 and f2, respectively. Nonlinearities in the first A/D converter 10 and in the first DFT processor 12 will produce harmonic distortion components at frequencies $2f_1$, $3f_1$, $4f_1$, etc. and at frequencies $2f_2$, $3f_2$, $4f_2$, etc. The nonlinearities will also produce intermodulation distortion components at frequencies which are the sums and differences of $f_1$ and $f_2$ and their harmonics, such as $(F_1+f_2)$, $(F_1-f_2)$, $(2F_1+F_2)$, etc. All these spurious frequency components will be included in the output of the DFT processor 12.

Now consider the signal components in the second channel in response to the same input signal 20. The signal at the output of the second lowpass filter 18' will have two components at frequencies $(f_1+\Delta f)$ and $(f_2+\Delta f)$, respectively. Nonlinearities in the second A/D converter 10' and in the second DFT processor 12' will produce harmonic distortion components at frequencies $2(f_1+\Delta f)$, $3(f_1+\Delta f)$, $3(f_2+\Delta f)$, etc. Intermodulation distortion components will also be produced at frequencies which are the sum and difference of $(f_1+\Delta f)$ and $(f_2+\Delta f)$ and their harmonics, such as $(f_1+f_2+2\Delta f)$, $(f_1-f_2)$, $(2f_1+f_2+3\Delta f)$, etc.

Comparing the signal and distortion components present in the two channels (i.e., in the outputs of the first and second DFT processors 12, 12'), it may be observed that the two spectral components $f_1$ and $f_2$ of the original undistorted signal 20 appear in the output of the second DFT 12' offset in frequency by the amount $\Delta f$ relative to the corresponding two components in the output of the first DFT 12. However, each of the distortion components in the second channel is offset in frequency by an amount other than $\Delta f$ (specifically, by either zero or a multiple of $\Delta f$) relative to its corresponding distortion components in the first channel. In particular, the three intermodulation distortion components cited by way of example in the previous paragraph appear in the second channel at frequencies offset by the amounts $2\Delta f$, zero, and $3\Delta f$, respectively, relative to their corresponding components in the first channel.

In general, each spurious spectral component in the second channel will be offset in frequency from its counterpart (i.e., its corresponding spectral component) in the first channel by an amount $N.\Delta f$, where $N=2, 3, 4, \ldots$ in the case of harmonic distortion components, and where N is any positive or negative integer or zero in the case of intermodulation distortion components.

Thus, all of the harmonic distortion components, and most of the intermodulation distortion components (all but those for which $N=1$), can be identified and suppressed by identifying each spectral component in the output of the second DFT processor 12' which is offset by an amount other than $\Delta f$ from this counterpart in the output of the first DFT processor 12. This is the operating principle of the present invention.

Referring again to FIG. 1, comparator 22 compares the two spectra from the first and second DFT processors 12 and 12'. It identifies each spectral component in the output of the first DFT 12 for which there is no corresponding component in the output of the second DFT 12' which is offset from it in frequency by the amount $\Delta f$.

In the preferred embodiment, each DFT 12 or 12'0 serially outputs a series of digital words, where each successive word represents the amplitude of the signal spectrum at a successive frequency value. For example, five successive words may represent the amplitude of the spectral components of input signal 20 at five successive frequencies of 1000 Hz, 1010 Hz, 1020 Hz, 1030 Hz, and 1040 Hz.

In order for comparator 22 to compare spectral components from the first and second DFT's 12 and 12' which are offset from each other by $\Delta f$ (where $\Delta f$ is the offset between the frequencies of the first and second local oscillators 14 and 14'), comparator 22 may simply include a shift-register 24 which functions as a delay line to introduce an M-word offset between the outputs of the two DFT's. If the increment in frequency between successive words is $f_s$, then the appropriate number of stages of delay in shift register 24 is $M=\Delta f/f_s$. Continuing the example of the previous paragraph, successive words outputted by the DFT 12 or 12' represent successive frequencies at increments $f_s=10$ Hz. Let us suppose that the frequency offset $\Delta f$ between the first and second local oscillators 14 and 14' is 40 Hz. Then shift register 24 should have $M=\Delta f/f_s=40$ Hz/10Hz$=4$ stages of delay; i.e., it should delay the output of the second DFT processor 1' by four words.

A simple comparator 26 compares the outputs of first DFT 12 and shift registor 24 on a word-by-word basis. If both words have approximately the same numerical value, this indicates that the same spectral component appears in both channels offset in frequency by $\Delta f$. The comparator 26 produces a logical "1" at its binary output 28 to indicate that this word represents a valid spectral component of the input signal 20. Binary output 28 can also be used to control a 2-input multiplexor 31 to allow the value of this spectral component to be transmitted from the output of first DFT 12 to the system output 32.

On the other hand, if comparator 26 detects that the respective words from first DFT 12 and shift register 24 are significantly different in value, comparator 26 produces a logical "0" at its binary output 28 to indicate that this word represents a spurious spectral component arising from nonlinearities in the spectrum analyzer In response to this logical "0" value at its control input, multiplexor 31 connects a zero value to the system output 32, thereby removing the spurious component from the output spectrum.

Figure 2:
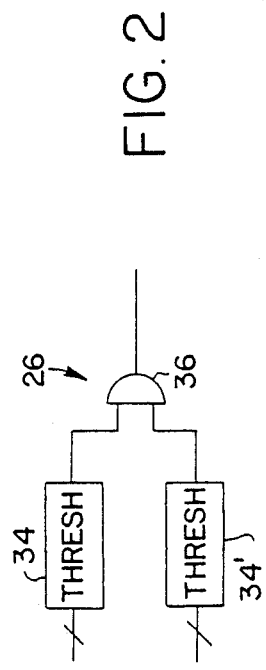
FIG. 2 is a block diagram of one implementation of the comparator used in the present invention.

FIG. 2 shows a simple implementation of comparator 26 comprising two threshold circuits 34 and 34' and a binary AND gate 36. Each threshold circuit is in effect a one-bit A/D converter; it outputs a logical one or zero according to whether the input word is greater or less than a predetermined threshold value. This implementation assumes that if the values of the two words from first DFT 12 and shift register 24 both exceed the predetermined threshold, then they both represent the same spectral component. This is simpler to implement than a circuit that actually compares the values of the two words. A more sophisticated approach would be for a microprocessor to adaptively adjust the threshold in accordance with the average amplitude of the input signal 20.

The system depicted in FIG. 1 is designed to receive a radio frequency (RF) input signal 20, so that the mixers 16 and 16' are necessary to shift the input signal to a lower frequency range, referred to as the IF or baseband frequency range. If the input signal frequency is already low enough for the spectrum analyzer to process, the first local oscillator 14, mixer 16 and filter 18 can be omitted. This is equivalent to setting $f_{LO}=0$. The second local oscillator 14' would be designed to oscillate at the desired offset frequency $\Delta f$.

If it is possible to apply the same input signal 20 to the system twice in succession, such as by storing it in an analog delay line, then the hardware in the second channel can be eliminated. In this embodiment, referred to as the "recursive" embodiment, the input signal 20 is applied to the first channel with the frequency of the first local oscillator 14 set to $f_{LO}$. The resulting output of the DFT processor 12 is stored in a memory, not shown.

Next, the input signal 20 is applied a second time to the first channel, with the frequency of the first local oscillator 14 set to ($f_{LO}+\Delta f$). Comparator 22 compares the current output of the DFT processer 12 with the previous DFT output stored in the memory.

The present invention is also applicable to systems using analog spectrum analyzers instead of DFT processors. In the embodiment shown in FIG. 1, a first analog spectrum analyzer would be substituted for the first A/D connector 10 and first DFT 12, and a second analog spectrum analyzer would be substituted for the second D/A converter 10' and second DFT 12'.

I claim:

1. Apparatus for suppressing distortion components in the output produced by a spectrum analyzer in response to an input signal, comprising:
   a first mixer circuit for receiving the input signal and producing a first IF signal having a spectral distribution shifted in frequency from that of the input signal by an amount $f_{LO}$;
   a second mixer circuit for receiving the same input signal and producing a second IF signal having a spectral distribution shifted from that of the input signal by an amount $f_{LO}+\Delta f$;
   first and second spectrum analyzers for receiving the first and second IF signals, respectively, and producing first and second spectrum output signals which represent spectral components of the first and second IF signals, respectively; and
   output signal processing means for comparing the spectral components in the first and second spectrum output signals and for suppressing any components in the first spectrum output signal which do not also appear in the second spectrum output signal as components that are offset in frequency by the amount $\Delta f$ from their respective counterparts in the first spectrum output signal.

2. Apparatus as defined in claim 1, wherein:
   the spectrum analyzers are discrete Fourier transform (DFT) processors, each producing a stream of output signals representing the spectral components of the respective IF signals.

3. Apparatus as defined in claim 2, wherein:
   the times of occurrence of the output signals in each stream of output signals are indicative of the frequencies of the spectral components; and
   the output signal processing means includes delay means connected in the output of the second DFT processor, to shift the output stream of that processor by a time offset equivalent of $\Delta f$, to facilitate comparison between the two streams of output signals.

4. Apparatus as defined in claim 3, wherein the output signal processing means further includes:
   a comparator circuit for comparing the first output stream and the time-delayed second output stream, and generating output signals indicative of the result of the comparison; and
   switching means responsive to the output signals from the comparator circuit, for disabling output from the apparatus upon the failure of the comparator circuit to detect matching input signals.

5. Apparatus as defined in claim 4, wherein:
   the switching means includes a multiplexor controlled by the output of the compartor circuit and having a first in put derived from the first DFT processor selected when the comparator ciruict indicates a match, and a second input of a null signal selected when the comparator circuit indicates a non-match.

6. Apparatus as defined in claim 4, wherein:
   the comparator circuit includes two input threshold circuits to provide outputs when the inputs exceed a preselected threshold valve; and
   an AND gate connected to receive the outputs of the threshold circuits, and to provide a comparator circuit output.

7. Apparatus for suppressing distortion components in the output produced by a spectrum analyzer in response to an input signal, comprising:
   mixing means, for producing from the input signal first and second derived signals, of which the corresponding spectral components are separated from each other by a frequency offset $\Delta f$;
   first and second spectrum analyzers for receiving the first and second derived signals, respectively, and producing first and second spectrum output signals which represent the spectral components of the first and second derived signals, respectively; and
   output signal processing means for comparing the spectral components in the first and second spectrum output signals and for suppressing any components in the first spectrum output signal which do not also appear in the second spectrum output signal as components that are offset in frequency by the amount $\Delta f$ from their respective counterparts in the first spectrum output signal.

8. Apparatus as defined in claim 7, wherein:
   the spectrum analyzers are discrete Fourier transform (DFT) processors, each producing a stream of output signals representing the spectral components of the respective derived signals.

9. Apparatus as defined in claim 8, wherein:
   the times of occurrence of the output signals in each stream of output signals are indicative of the frequencies of the spectral components; and
   the output signal processing means includes delay means connected in the output of the second DFT processor, to shift the output stream of that processor by a time offset equivalent of $\Delta f$, to facilitate comparison between the two streams of output signals.

10. Apparatus as defined in claim 9, wherein the output signal processing means further includes:
    a comparator circuit for comparing the first out-put stream and the time-delayed second output stream, and generating output signals indicative of the result of the comparison; and
    switching means responsive to the output signals from the comparator circuit, for disabling output from the apparatus upon the failure of the comparator circuit to detect matching input signals.

11. Apparatus as defined in claim 10, wherein:
    the switching means includes a multiplexor controlled by the output of the comparator circuit and having a first input derived from the first DFT processor selected when the comparator circuit indicates a match, and a second input of a null signal selected when the comparator circuit indicates a non-match.

12. Apparatus as defined in claim 10, wherein:
    the comparator circuit includes two input threshold circuits to provide outputs when the inputs exceed a preselected threshold valve; and
    an AND gate connected to receive the outputs of the threshold circuits, and to provide a comparator circuit output.

* * * * *